United States Patent [19]

Smith et al.

[11] Patent Number: 5,142,224

[45] Date of Patent: Aug. 25, 1992

[54] NON-DESTRUCTIVE SEMICONDUCTOR WAFER PROBING SYSTEM USING LASER PULSES TO GENERATE AND DETECT MILLIMETER WAVE SIGNALS

[75] Inventors: Thane Smith, Middletown; Ho-Chung Huang; Chi Hsiang Lee, both of Potomac, all of Md.

[73] Assignee: COMSAT, Washington, D.C.

[21] Appl. No.: 690,329

[22] Filed: Apr. 26, 1991

Related U.S. Application Data

[63] Continuation of Ser. No. 283,703, Dec. 13, 1988, abandoned.

[51] Int. Cl.⁵ .................. G01R 31/28; G01R 31/26
[52] U.S. Cl. .................. 324/158 R; 324/96; 324/158 T
[58] Field of Search .......... 324/158 R, 158 D, 158 T, 324/96, 73.1

[56] References Cited

U.S. PATENT DOCUMENTS

| | | | |
|---|---|---|---|
| 3,781,683 | 12/1973 | Freed | 324/73.1 |
| 3,801,910 | 4/1974 | Quinn | 324/158 D |
| 3,849,872 | 11/1974 | Hubacher | 324/158 T |
| 3,956,698 | 5/1976 | Malmberg et al. | 324/158 D |
| 4,122,383 | 10/1978 | von Roos | 324/158 D |
| 4,288,911 | 9/1981 | Ports | 324/158 T |
| 4,413,271 | 11/1983 | Gontowski, Jr. et al. | 324/158 T |
| 4,446,425 | 5/1984 | Valdmanis et al. | 324/96 |
| 4,482,863 | 11/1984 | Auston et al. | 324/158 D |
| 4,603,293 | 7/1986 | Mourou et al. | 324/96 |
| 4,618,819 | 10/1986 | Mourou et al. | 324/96 |
| 4,719,411 | 1/1988 | Buehler | 324/158 R |
| 4,896,109 | 1/1990 | Rauscher | 324/158 D |
| 4,933,634 | 6/1990 | Cuzin et al. | 324/158 R |
| 4,961,053 | 10/1990 | Krug | 324/158 R |

FOREIGN PATENT DOCUMENTS 2202639 9/1988 United Kingdom .................. 324/96

Primary Examiner—Ernest F. Karlsen
Attorney, Agent, or Firm—Sughrue, Mion, Zinn, Macpeak & Seas

[57] ABSTRACT

Electrical devices are characterized by optically triggering an electrical signal onto the device and then optically sampling the electrical signal waveform on the device.

14 Claims, 12 Drawing Sheets

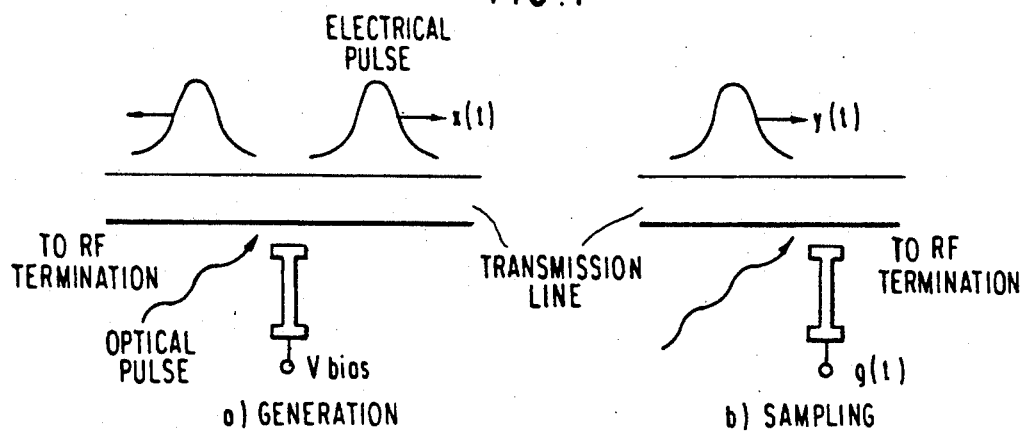
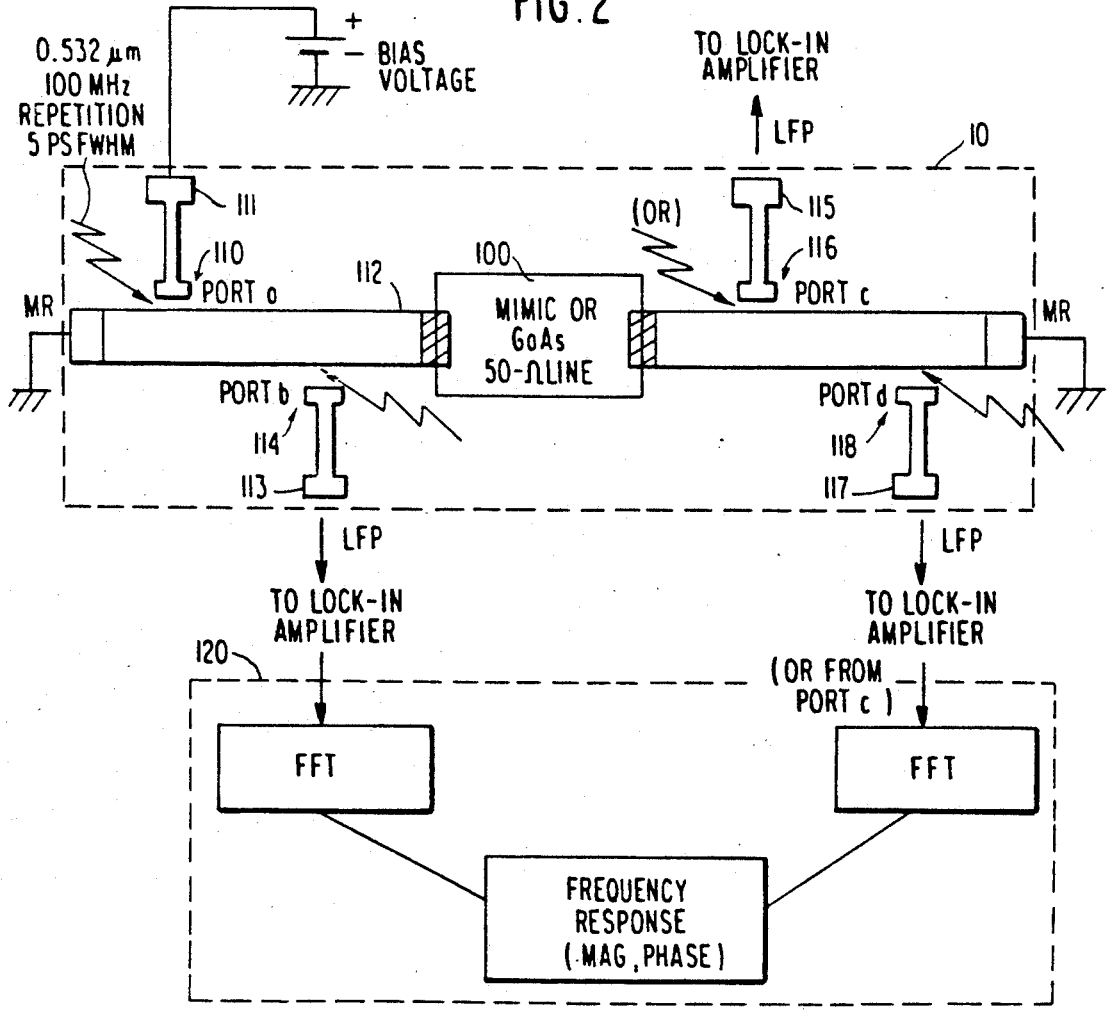

VERTICAL SCALE: 0.5 μA/div
HORIZONTAL SCALE: 2V/div

P<sub>OUT</sub> AND η<sub>po</sub> vs FREQUENCY

GAIN RESPONSE

MAGNITUDE

PHASE

MAGNITUDE

PHASE

MAGNITUDE

PHASE

MAGNITUDE

PHASE

NON-DESTRUCTIVE SEMICONDUCTOR WAFER PROBING SYSTEM USING LASER PULSES TO GENERATE AND DETECT MILLIMETER WAVE SIGNALS

This is a continuation of application Ser. No. 07/283,703 filed Dec. 13, 1988 now abandoned.

BACKGROUND OF THE INVENTION

The invention is directed to a non-destructive wafer probing system for characterizing monolithic microwave integrated circuits (MMICs). FETs and other devices, and more particularly to such a system for characterizing these devices as a function of signal frequency up to at least 100 GHz.

Gallium arsenide (GaAs) microwave and millimeter-wave devices and monolithic integrated circuits are currently being developed for applications such as satellite communications, radar, and phased-array systems. The conventional frequency domain approach for testing these discrete devices and MIMIC chips usually constitutes one of the major costs of a development program. This is especially true for devices and circuits operating in the millimeter-wave regime. Therefore, a low-cost testing technique which allows on wafer characterization of MMICs before dicing the wafer into individual chips is highly desirable.

In addition to the cost factor, the evaluation of these devices becomes more difficult as applications extend to the higher millimeter wave frequencies. Fairly accurate characterization of active devices and monolithic circuits can be achieved by using a waveguide measurement system that offers small attenuation, and with careful design may achieve low mismatch loss. However, this approach is inherently limited by the waveguide bandwidth, resulting in the need for multiple calibrations for different waveguides when measurements are made over a wide frequency range. Furthermore, high-performance waveguide-to-microstrip transitions for each waveguide band, and careful assembly of the interface between these transitions and the MMIC test block, are required. Such an evaluation process is quite time consuming. In addition, oscillations may occur during the characterization of active devices that are not terminated with matching circuits. This problem occurs because of the purely reactive termination presented by the waveguide below its fundamental mode cutoff frequency.

Current commercially available on-chip characterization systems for MMICs have provided useful performance data in the lower microwave range, and attempts are being made to extend their frequency of operation. However, several fundamental limitations still exist. Because these systems use special coplanar waveguide (CPW) probes. e.g.. as disclosed by E. W. Strid. "26-GHz Wafer Probing for MMIC Development and Manufacture," *Microwave Journal*, pp. 71–82, August 1986, it is difficult to achieve a low-loss, impedance-matched probe at millimeter-wave frequencies. The operating life of such a mechanical direct-contact probe is usually quite limited, and a customized probe card is required for each set of microwave circuits on the wafer. The circuits also require CPW patterns to be incorporated at various test locations on the wafer.

Recently, optical techniques have been used in the characterization of microwave devices and circuits. Frequency domain measurements have been performed using electro-optic probing of a microstrip line. e.g. as disclosed by B. Kolner et al. "Electro-optic Sampling in GaAS Integrated Circuits." *IEEE J. Quantum Electron.*, Vol. QE-22, pp. 79–93, January 1986 and K. J. Weingarten et al, "Picosecond Optical Sampling of GaAs Integrated Circuit." *IEEE J. Quantum Electron.*, Vol. QE-24. pp. 198–220, February 1988. In this work, the microwave signal was launched onto the circuit using CPW contacting probes. J. A. Valdmanis et al. "Subpicosecond Electrical sampling and Applications." *Picosecond Optoelectronic Devices*, Academic Press, pp. 209–270, 1984, have demonstrated that, by using an electro-optic probe containing polar material such as lithium tantalate, substrates which do not exhibit the electro-optic effect can still be probed. Some results for a GaAS field-effect transistor (FET) mounted on a silicon-on-sapphire (SOS) test circuit have been presented by D. E. Cooper et al, "Picosecond Optoelectronic Measurement of the High-Frequency Scattering Parameter of a GaAS FET." *IEEE J. Quantum Electron.*, Vol. QE-22, pp. 94–100, January 1986.

SUMMARY OF THE INVENTION

It is, therefore, an object of the present invention to provide a system for non-destructive wafer probing effective at millimeter-wave frequencies.

It is a further object of the invention to provide a wafer probing system which overcomes the disadvantages of high cost and inconvenience in the prior art.

These and other objects are achieved according to the present invention by a wafer probing system wherein both the electrical signal provided to the device under test (DUT) and the sampling of that signal are performed using optical switching. In the preferred embodiment of the invention, optical pulses for triggering the input electrical signal and for use as sampling pulses are all derived from a single laser pulse via suitable beam splitters and adjustable delays. A set of samples at one value of delay between the input signal and each of the sample points is taken, and then the delays are adjusted for a further set of samples. This is repeated until enough samples are taken to completely reconstruct the signal waveform, and then a Fourier transform algorithm is used on the time domain waveforms to obtain amplitude and phase as a function of frequency.

According to a further aspect of the invention, certain simple and standardizable auxiliary features are fabricated on the wafer and connected to each device or circuit to be characterized in such a manner that the auxiliary elements will be cut off from the device or circuit when the wafer is diced. The purpose of the auxiliary structures is to provide appropriate wideband terminations, e.g., 50 ohm impedance terminations, on the input and output, and to allow optical laser pulses to generate a very wideband signal to the input and also to sample the input and output voltage waveforms at selected points. Fourier transforms of these time domain waveforms give amplitude and phase as a function of frequency. The system may also be used to characterize individual chips (mounted without opaque covers) with the signal provided from a conventional signal generator. The advantage in this case is that the voltage waveform can be sampled at any desired point on the chip and non-linearities can be studied directly. The invention allows characterization up to a frequency given by the reciprocal of the duration of the voltage pulse generated on a transmission line by means of a laser pulse.

The invention described herein comprises an optoelectronic technique employing a picosecond pulse source which can be used for on-wafer MMIC characterization. To bring very closely spaced, independently adjustable and variably time delayed laser pulses to the semiconductor wafer, the preferred embodiment of the invention uses convex and concave lenses to demagnify the pattern of beam positions. Widely spaced parallel beams enter the large convex lens and closely spaced parallel beams exit from the concave lens. These lenses are used in combination with movable structures containing beam splitters, pathlength adjusters, and polarization analyzers. The distance between the two lenses may be adjustable to change the demagnification factor.

A further advantageous feature of the invention resides in the use of a very short duration pulse and using the Fourier transform of both incident and reflected pulses at a given site in a transmission line to derive $S_{11}$ vs frequency.

BRIEF DESCRIPTION OF THE DRAWINGS

The invention will be more clearly understood from the following description in conjunction with the accompanying drawings, wherein:

FIG. 1 is a schematic illustration of electrical pulse generation and sampling according to the present invention;

FIG. 2 is a schematic diagram of a measurement system according to the present invention;

DETAILED DESCRIPTION OF THE INVENTION

Figure 4:
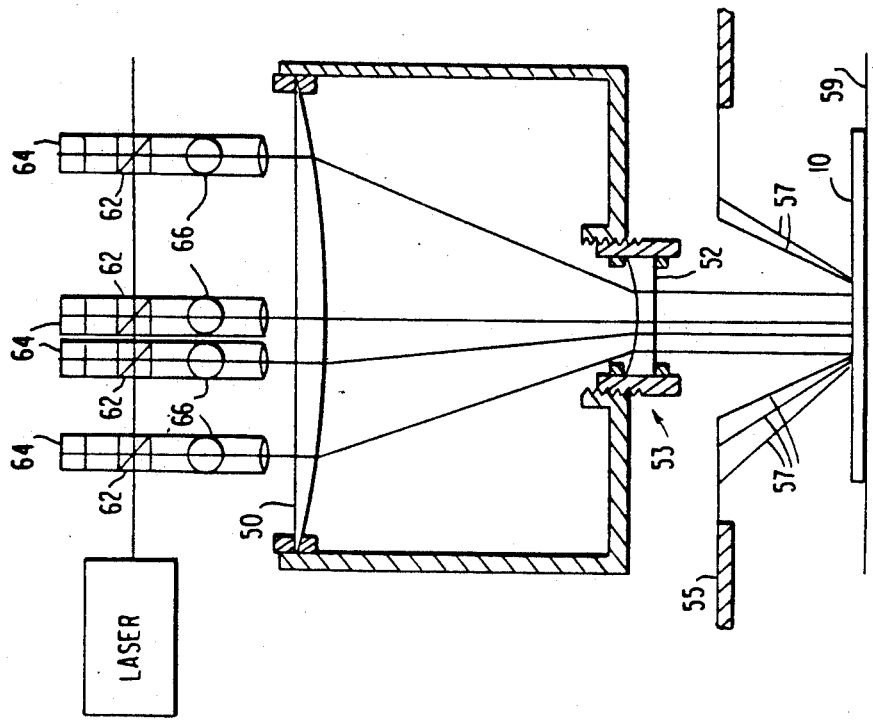
FIG. 4 is a further illustration of the pulse generating optical system.

The invention is an adaptation of a picosecond photoconductivity measurement technique, e.g., as disclosed by D. A. Auston. "Impulse Response of Photoconductor in Transmission Lines," *IEEE J. Quantum Electron.*, Vol. QE-19, pp. 639—648, April 1983, and D. A. Auston et al, "Ultrafast Optical Electronics: From Femtoseconds to Terahertz," *Picosecond Electronics and Optoelectronics*, Springer-Verlag 1985, pp. 2-7. This technique assumes a sufficiently low optical intensity such that small-signal conditions apply. The invention comprises a pulse generation/sampling technique using SOS photoconductors to obtain frequency domain scattering parameters for the FET. This approach has been extended for on-wafer implementation of monolithic circuits using GaAs photoconductive switches, including an experimental study of its accuracy and sensitivity. e.g. as disclosed by the present inventors in "Optical Electronic Characterization of Monolithic Millimeter-Wave Integrated Circuits," *12th Int. Conf. on Infrared and Millimeter Waves Conf. Dig.*, pp. 87—88, December 1987, and also by the present inventors in "On-Wafer Characterization of Monolithic Millimeter-Wave Integrated Circuit by a Picosecond Optical Electronic Technique," in IEEE MTT-S *Int. Microwave Symp. Dig.* (New York, N.Y.), pp. 237-240, May 1988.

FIG. 1 illustrates the generation and sampling operations, with the voltage pulse being generated by an incident optical pulse at the left side of the figure and sampled by an optical pulse at the right side. The time-dependent portion of the sampled signal as a function of delay time has been shown to correspond to a cross correlation between the electrical signal on the line and the photoconductive response of the sampling gap. The generation and sampling time responses are determined by the photoconductance of the gaps. For identical generation and sampling photoconductors, the time-dependent sampled signal $g_{xy}(t)$, is the cross correlation of the voltage pulse on the line at the output, y(t), and the generated voltage x(t). as $$g_{xy}(t) = \int_{-\infty}^{\infty} x(\tau)y(t + \tau)d\tau \tag{1}$$

FIG. 2 is a schematic diagram of the optoelectronic characterization system of this invention, including the device under test (DUT) 100. A short electrical pulse is generated by a DC-biased photoconductive switch 110 at port a and travels down the input transmission line 112 toward the DUT. A suitable switch is disclosed in *Picosecond Optoelectronics Devices*, Academic Press, 1984. The pulse traveling in the opposite direction, i.e., toward the left of port a in FIG. 2, is absorbed by the matched termination, which may be a coaxial load or can be implemented as an integrated monolithic resistor (MR). The pulse approximates a delta function in the time domain, resulting in a very broad frequency spectrum. Since the input electrical pulse generated is in complete time synchronization with the optical pulse, this electrical pulse can be precisely sampled at port b by a time-delayed laser pulse illuminating a second picosecond photoconductive switch 114 on the input side of the DUT 100.

The output of the DUT 100 can be sampled using the same procedure, with a photoconductive switch (116 or 118) at the output of the MMIC (port c or d). By comparing the Fourier transforms of the transmitted and reflected waveforms to those of the incident waveform in a signal processing computer 120, the two-port scattering parameters can be determined without using CPW probes.

Probe pads 111, 113, 115 and 117 are provided for coupling electrical signals to and from the photoconductive switches 110, 114, 116 and 118, respectively, during characterization. Further, although not necessary for the practice of the present invention in certain of its aspects, in the preferred embodiment the components 110-118 as well as the terminations MR are all formed on a single wafer 10, together with the DUT, and can be separated from the DUT by dicing after characterization of the device is completed.

In the following analysis (referenced to the measurement system schematic shown in FIG. 2), a picosecond electrical pulse is generated at port a. The signal at port b corresponds to an autocorrelation of the voltage pulse, $f_i(t)$, created at port a (assuming identical photoconductors at ports a and b) and is obtained by illumination of the gaps associated with ports a and b. The time-dependent sampled signal at port b is given by $$g_{bi}(t) = f_i(-t) * f_i(t) \tag{2}$$

where * represents the convolution operation, the first subscript on g(t) refers to the port identification, and the second refers to the incident (i), reflected (r), or transmitted (t), signal, depending on which is measured. In equation (2) it is assumed that the time domain signal is windowed (by selecting the length of sampling time) so that only the contribution from the incident signal is measured. The frequency domain spectrum on the sampled input signal at port b is $$G_{bi}(f) = |F_i(f)|^2 \tag{3}$$

If the time domain window at port b is such that only the reflected signal $f_r(t)$ is sampled, then the reflected time domain waveform $$g_{br} = f_i(-t) * f_r(t) \tag{4}$$

can be obtained. Thus, the spectrum of the windowed reflected signal which is sampled is $$G_{br}(f) = F_i^*(f) \cdot F_r(f) \tag{5}$$

where $F_i^*$ is the complex conjugate of $F_i$.

At the output of the MMIC, the voltage pulse is given by $$f_o(t) = h(t) * f_i(t) \tag{6}$$

where h(t) is the impulse response of the DUT. The photoconductive switches in the output network are the same as those used for generation and sampling in the input network. The sampled signal at port c or d is given by the cross correlation of $f_i(t)$ with $f_o(t)$, or $$g_{ci}(t) = f_i(-t) * f_o(t) \tag{7}$$

The Fourier transform of $g_{ci}(t)$ is therefore $$G_{ci}(f) = |F_i(f)|^2 H(F) \tag{8}$$

The complex input scattering parameters, $S_{11}(f)$ and $S_{22}(f)$ for the DUT can thus be expressed as a function of frequency, as $$S_{21}(f) = \frac{G_{ci}(f)}{G_{bi}(f)} \tag{9}$$

$$S_{11}(f) = \frac{G_{br}(f)}{G_{bi}(f)} \tag{10}$$

Equations (9) and (10) establish the phase reference planes at ports b and c; however, these references can be adjusted. The complex scattering parameters, $S_{12}(f)$ and $S_{22}(f)$ can also be obtained in a similar manner. The time domain to frequency domain transforms are performed numerically using a Fast Fourier transform (FFT) algorithm on a computer also used to control the experiment.

The optical system and components including the laser source and the GaAs photoconductive switch to generate the electrical pulse will now be described.

Figure 3:
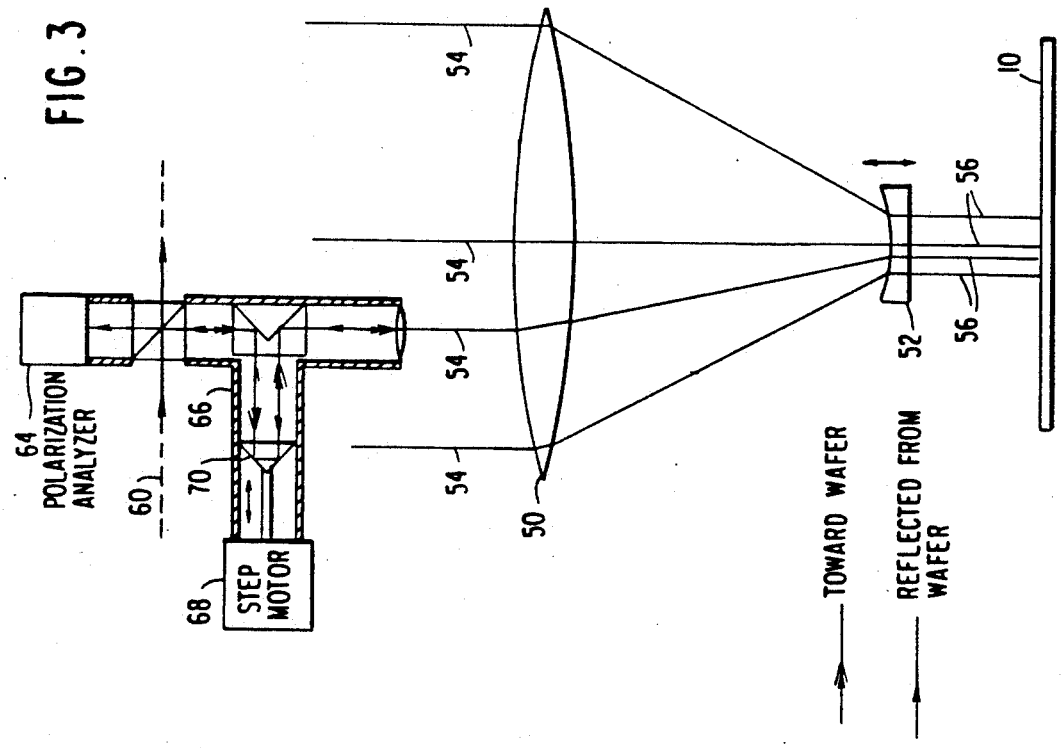
FIG. 3 is a structural diagram of optical system components for generating plural sampling pulses according to the present invention.

As shown in FIG. 3, the preferred embodiment of the present invention uses a convex lens 50 and a concave lens 52 to demagnify the pattern of beam positions. Widely spaced parallel beams 54 enter the large convex lens 50 and closely spaced parallel beams exit from the concave lens 32 to strike the semiconductor wafer. These lenses are used in combination with movable structures containing beam splitters, path length adjusters, and polarization analyzers. For example, a primary laser beam 60 would be split by a beam splitter 62, with a portion of the beam being directed upwardly to a polarization analyzer 64 and a portion of the beam being directed downwardly to a path length adjuster 66 where a stepper motor 68 would vary the horizontal position of a reflective member 70 to effectively vary the length of the optical path followed by the laser. The number of path length adjusters disposed along the primary laser beam path would preferably be equal to the number of optical switch triggers to be generated, and they would advantageously be arranged such that the reflective member 70 would move along a path perpendicular to the path of the primary laser beam. The distance between the two lenses could be adjustable, e.g., by adjusting the vertical position of the concave lens 52, to change the demagnification factor.

Figure 5:
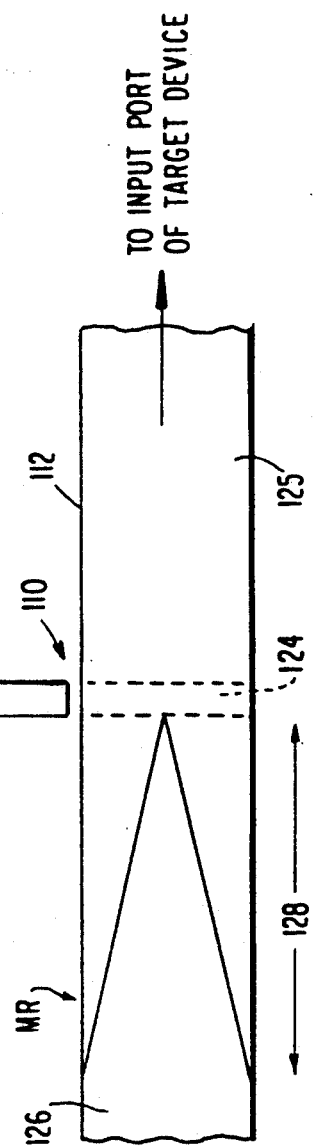
FIG. 5 is a diagram of one technique for generating a short duration voltage pulse.

A more complete diagram of the wafer probing optical system is shown in FIG. 4. As shown, the various laser beam positions can be moved only in one dimension, e.g., by independent movement of any of the path length adjusters 66 along the beam path. The path length adjusters in FIG. 5 are rotated 90° with respect to the path length adjuster shown in FIG. 3, so that they can be spaced more closely. The distance between the lenses 50 and 52 is variable by moving the lens 52 vertically by means of its threaded mounting 53. A probe card 55 supports a plurality of metal low frequency probes 57 for contacting the ports a, b, c and d on the wafer 10. The wafer 10 is preferably supported on a movable support 59. Two dimensional positioning of beams is also possible by use of additional beam splitters and a more complicated mechanical system. Not shown are means to sense and digitize the actual path length differences of each beam from whichever beam is used to generate the voltage pulse, to do the required computations and display the results, and the electronic and mechanical equipment to control the entire system. The technology to implement these items is well known by electronic instrument manufacturers.

FIG. 5 shows one type of structure which can be fabricated on a high resistivity semiconductor wafer which allows a laser pulse to generate an electrical pulse on a transmission line. The probe pad 111 may be made of plated gold 121 plated on an ohmic contact metal 123. The transmission line 112 is a 50-$\Omega$ microstrip line, e.g., having a low resistivity metal 125 as a top conductor making an ohmic contact to the high resistivity semiconductor substrate in a region 124. Without laser pulse illumination, the DC bias pulse voltage coupled to the probe pad 111 is blocked from the microstrip line by a picosecond photoconductor gap 110 with very high dark resistivity. The laser pulse illumination will briefly make the gap conducting, and it will generate two voltage pulses traveling in opposite directions from the generation site. The one traveling away from the device or circuit to be characterized (target device) is absorbed by a length of microstrip line with high attenuation so that it will not be reflected. This length of high attenuation microstrip line is designated by reference characters MR in each of FIGS. 2 and 5, and as shown in FIG. 5 may be formed of a high resistivity metal top conductor 126 for a lossy microstrip line making a gradual transition to the low resistivity metal 125 over the region 128. This same non-reflecting termination also absorbs any reflections from the target device. The voltage waveform is sampled at one or more points between the pulse generation site and the input port of the target device e.g., at part b in FIG. 2.

The voltage waveform on the transmission line is found by the well known technique of sampling. The pulsed laser produces identical waveforms each time a pulse arrives at the photoconductive gap 110 shown in FIG. 5. As shown in FIGS. 3 and 4, several beams are derived from the same laser pulse by means of beam splitters 62. These deliver a laser pulse to other locations along the transmission line. The arrival time of one of these relative to the laser pulse arrival time at the photoconductive gap depends on the path length difference between them. The path length adjustors shown in FIG. 3 are used to adjust the time delay. As will be explained below, a laser pulse arriving at a point on the transmission line can produce an effect proportional to the voltage at that time and at that point on the line. Voltage samples associated with many laser pulses with many different values of time delay are used to reconstruct the shape of the voltage vs. time waveform. The optical probing system would automatically control the path length adjustments and record the data. It would also use these data to compute the Fourier transform yielding the frequency spectrum of the voltage pulse. It should be noted that the technique of optical sampling of voltage waveforms can also be applied to structures other than transmission lines.

Figure 6:
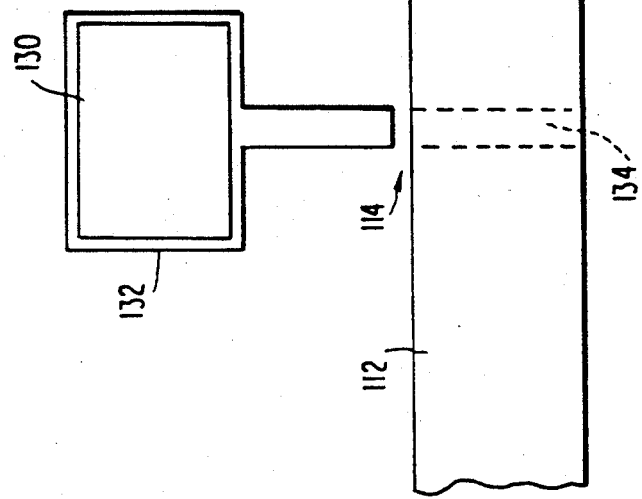
FIG. 6 is an illustration of one technique for optical sampling.

One technique for using a laser pulse to obtain a voltage sample depends on structures fabricated on the semiconductor wafer at the locations where the voltage is to be sampled. These are similar to the structure used to generate the voltage pulse as is shown in FIG. 6. In FIG. 6, a metal plate 130 is formed on an ohmic contact metal 132 to form both a probe pad and a small value capacitor to ground. As in the case of FIG. 5, the transmission line 112 is a low resistivity top conductor making an ohmic contact at 134 to the high resistivity semiconductor substrate. What happens in this technique is that the laser pulse, time delayed with respect to the pulse used in FIG. 5, is focused on a photoconductive gap 114 between the transmission line 112 and a capacitor formed at the metal plate 130. During the photoconductive transient, a quantity of charge is transferred to the capacitor. The amount of charge is proportional to the voltage on the transmission line integrated over the duration of the photoconductive transient. The resulting voltage on the capacitor is then proportional to the voltage on the transmission line during this time interval. This voltage is measured using conventional metal probe tips. The capacitor is discharged before the next laser pulse. The photoconductive transient used to generate the voltage pulse on the transmission line will be of the same duration and have similar shape to the one used to sample the voltage. Therefore, the waveform obtained by this technique is really an autocorrelation function from which the actual transmission line voltage waveform must be computed.

Another technique uses polarized laser pulses. An electric field in the semiconductor causes rotation of the plane of polarization, and this is then detected at one of the polarization analyzers 64 shown in FIG. 3 or 4. The angle of rotation is proportional to the electric field strength. If the laser light passes through a portion of the semiconductor near the edge of the transmission line, it will encounter an electric field proportional to the voltage at that point on the line. Compared to the previously described method, better time resolution can be obtained by this method because the duration of the laser pulse is typically much shorter than the duration of the photoconductive pulse. It also has the advantage of not requiring any special structures on the semiconductor. A disadvantage is that measurement of the rotation of the polarization will probably require many laser pulses at the same time delay, increasing the total measurement time.

The use of rotation of the plane of polarization to obtain a voltage sample has some engineering problems. The maximum rotation for a given voltage is obtained by using a laser wavelength to which the semiconductor is transparent so that the beam can pass through the entire thickness, be reflected from the ground plane metal, and pass again through the same thickness of semiconductor. Such a wavelength, however, is not efficient in producing the photoconductive transient needed to generate a voltage pulse on the transmission line (photons must be absorbed to generate hole-electron pairs). Nevertheless, as long as there is some absorption, a voltage pulse can be generated. It is possible to obtain sufficient rotation even if the laser light is only reflected from the top surface, since the electromagnetic fields, even in this case, penetrate some distance into the semiconductor. The most effective laser wavelength to give the best compromise between efficient pulse generation and detection would be determined on an empirical basis. Another possibility is to pass the generating pulse through a nonlinear medium to generate a pulse of half the original wavelength.

Since the semiconductor is not transparent to shorter wavelength pulses, an optical frequency doubler may be used to effectively halve the wavelength of the pulse when using the capacitive sampling technique. Less transparency to the pulse will means the generation of a greater number of electron-hole paris, and consequent greater photoconductivity at the switch. When using the polarization analysis technique, it is necessary that the pulses pass through the semiconductor, so that the longer wavelength of the original laser pulse may be used. A combination of both shorter and longer wavelength pulses would have the original longer wavelength pulse used for the polarization sampling while a frequency doubler would be disposed in the optical path of the pulse used for the photoconductive switch which serves as the pulse generator.

Figure 7:
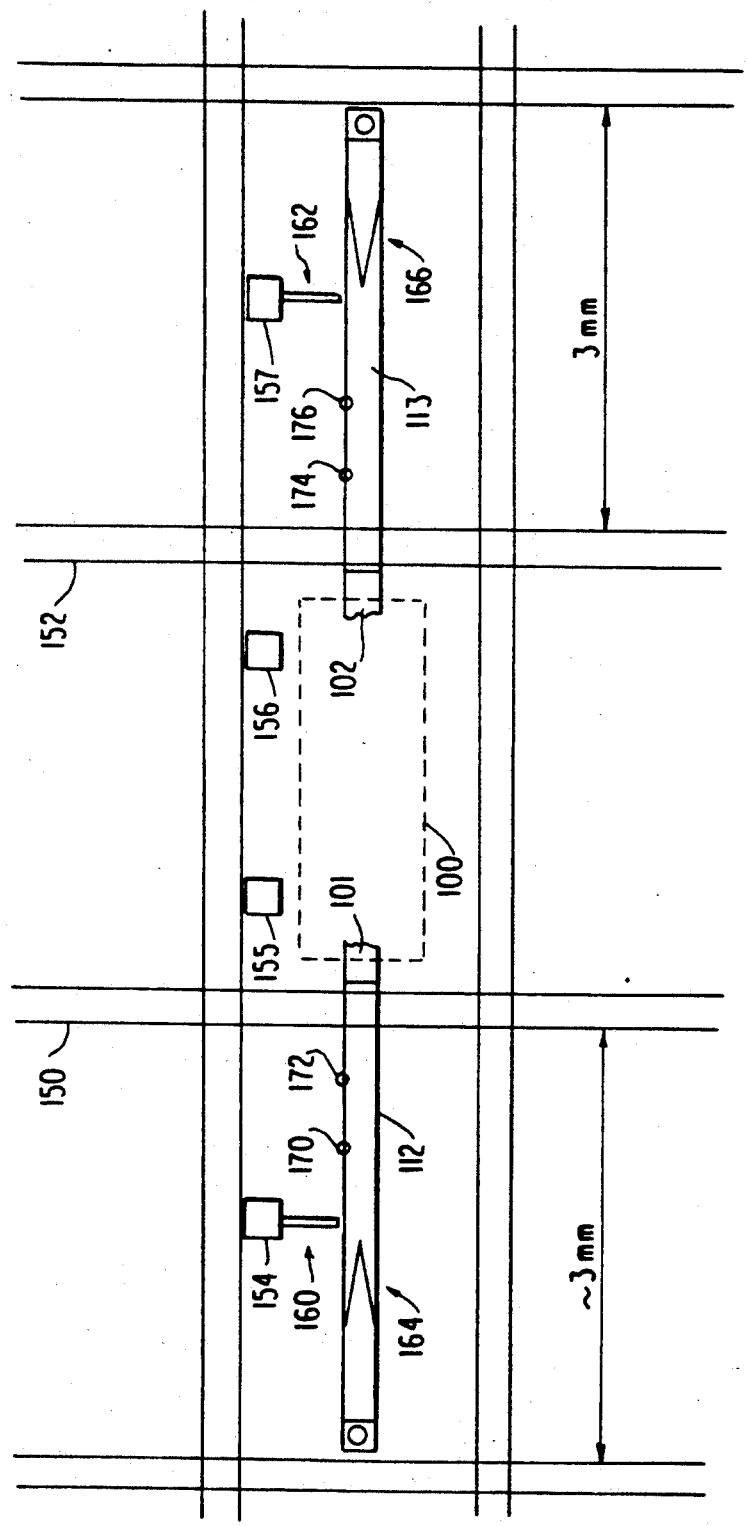
FIG. 7 is an illustration of an example of a test structure for S-parameter characterization.

FIG. 7 shows how the structures already described would be connected to a target device so that S-parameters could be measured by the optical probing system. Identical 50-Ω microstrip lines 112 and 113 are attached across saw lanes 150 and 152, respectively to the input and output ports 101 and 102 of the target device 100. DC bias is supplied through conventional metal probe tips applied to bias pads 154, 155, 156 and 157. Each 50-Ω line has a branch line structure 160, 162 separated from the main line by a photoconductive gap. These are the voltage pulse generators. A gradual transition to lossy line occurs beyond these in the direction away from the target device, in the regions 164 and 166. Two waveform sampling sites 170, 172 and 174, 176 are selected in each microstrip line between the pulse generator and the target device. The distance from the input port of the target device to the nearest of these sites, e.g. 172, is chosen to be large enough so that the reflected pulse from the target device will not overlap the incident pulse. For a microstrip line on semi-insulating GaAs, and a voltage pulse duration of 10 pS, the pulse length along the microstrip line is 0.83 mm. About half a millimeter would be required between the input port and the nearest measurement site. The real and imaginary parts of Fourier transforms of the incident and reflected waveforms at either site 170, 172 gives $S_{11}$. The second measurement site gives attenuation and dispersion along the line allowing translation of $S_{11}$ to the input port. $S_{21}$ is obtained from the ratio of the incident wave Fourier amplitudes to the Fourier amplitudes measured at one of the sites 174, 176 in the output microstrip lines. To find $S_{12}$ and $S_{22}$ the pulse generator 162 in the output line is used to generate a pulse to the output port of the target device. The same procedure described above is used to measure the incident and reflected signal at the output port.

The test structures described above may be inconveniently large. The microstrip transmission line including the lossy termination needs to be approximately 3 mm long. This dimension is typical of GaAs MMIC chips, and much larger than the typical dimensions of GaAs FETs. Two such structures are required for each target device. To allow characterization on every MMIC on a wafer would require about two thirds of the wafer to be occupied by the test structures. The ratio would be even worse for discrete devices such as FETs. In practice it would be likely that only a few of the MMIC or devices on the wafer would be selected for this type of characterization.

Figure 8:
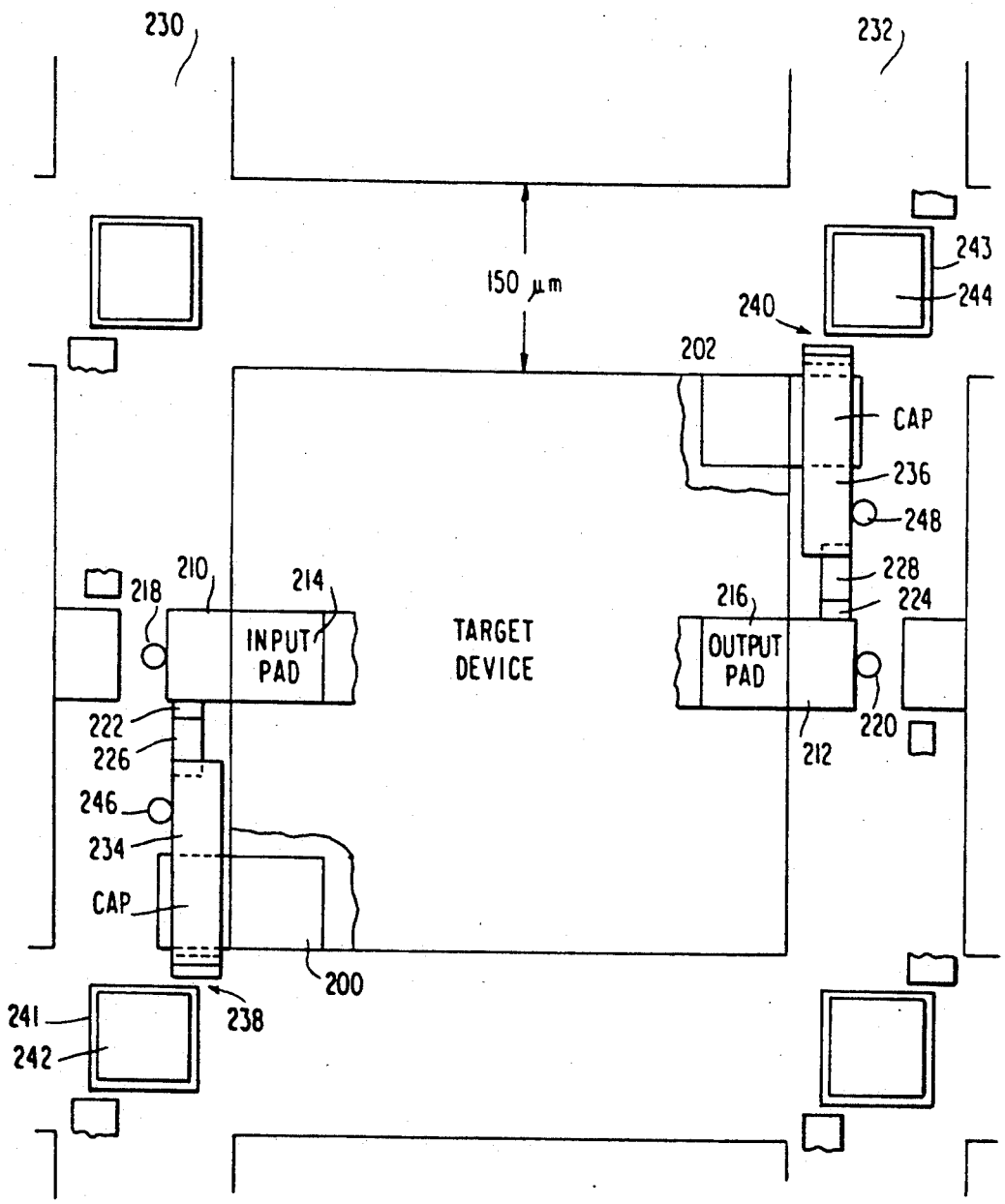
FIG. 8 is an illustration of lumped element test structures.

More compact test structures using lumped elements are also possible. The input and output ports of chips are usually bond pads near the chip edges. These are suitable places to sample voltage waveforms. FIG. 8 shows how lumped elements small enough to fit in 150-Mm wide saw lanes could be connected to allow characterization. It is assumed here that ground pads 200, 202 serving as capacitor bottom plates can be placed near the input and output on the chip which is the target device for characterization. The pulse generation and voltage sampling laser beams need to be focused to a small spot diameter (4-6 Mm). The beams need to be positionable in two dimensions to a minimum separation on the order of 50 micrometers. It is also assumed that metal probes can provide dc bias and grounding while not perturbing the signal frequency impedances attached to the input and output ports. This can be done if the probes have high enough inductance to appear as open circuits to the signal frequency, and the probe placement is chosen carefully.

FIG. 8 shows ohmic metal areas 210 and 212 extending into the saw lanes from the input and output pond pads 214 and 216. Voltage sampling sites 218 and 220 are located at the edges of these metal areas. A 50 ohm resistor 222 or 224 connects each of them to another ohmic contact 226 or 228 in the saw lane 230 or 232 which ohmic contact is attached to the top plate 234 or 236 of a capacitor to ground. The 50-ohm resistor is formed of a GaAs N+ layer (100 ohms per square). A photo conductive gap 238 or 240 separates another part of the top plate from metal 241 or 243 connected to a probe pad 2424 or 244 for providing a DC voltage across the gap. Voltage sampling sites 218, 220, 246 and 246 are shown for voltage measurement on both the top plate and the device input or output port. Since the voltage difference is current times resistance, both voltage and current waveforms can be found at the input and output of the target device. Again. Fourier transformation is used to obtain the signals in the frequency domain. The current and voltage amplitudes and phases are used to compute the two port admittance (or impedance) matrix (S-parameters can be mathematically derived from this).

Figure 9:
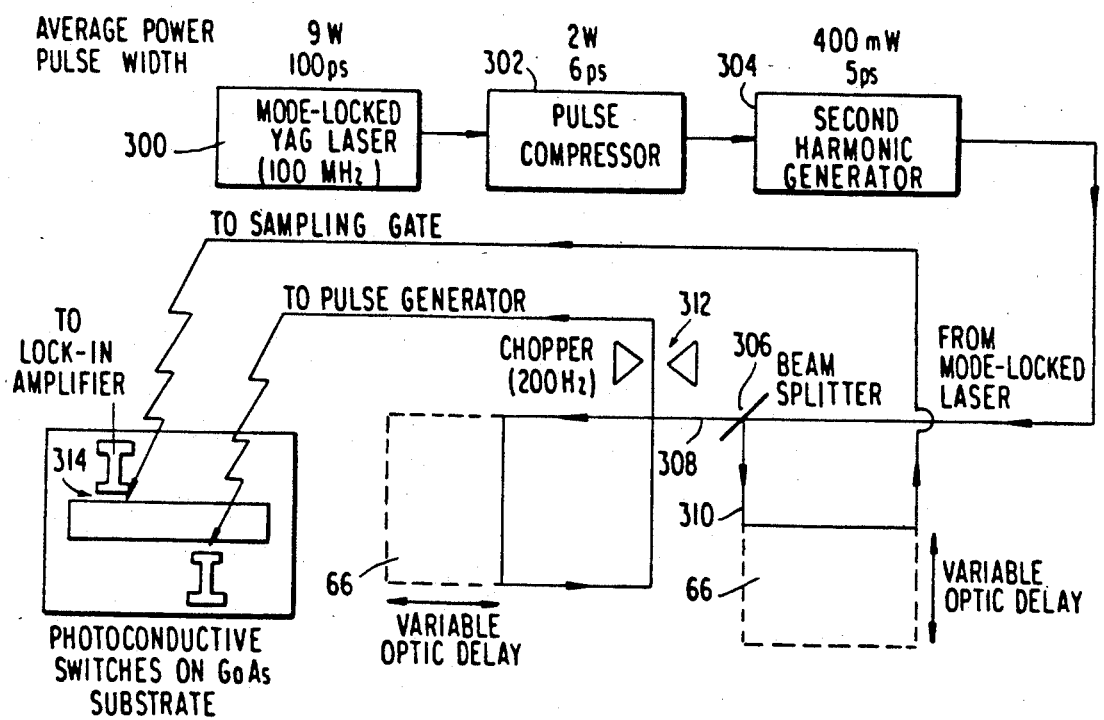
FIG. 9 is a schematic diagram of the optical system with delay line and switch components.

The wafer probing optical system is further schematically shown in FIG. 9. It consists of a continuous-wave actively mode-locked Nd:YAG laser 300, whose output is compressed by a fiber-grating pair pulse compressor 302 and then frequency doubled by passing through a potassium titanyl phosphate (KTP) crystal 308. The optical pulses have a wavelength of 532 nm (green spectrum), a repetition rate of 100 MHz, a full-width-at-half-maximum (FWHM) pulse duration of 5 ps, and an average power of 400 mW. The laser output is split by beam splitter 306 into two beams in FIG. 9: one beam 308 focused on the pulse generator photoconductive switch, and the other beam 310 focused on the sampling gate, with a typical fluence of 30 $\mu J/cm^2$. Two separate stepper motors (not shown) vary the length of the delay line between for the two laser beams: via path length adjusters 66 as described earlier herein a high-resolution stage with a step size of 0.4 $\mu m$ and travel distance of 5 cm, and a longer delay stage with a step size of 10 $\mu m$ and a total travel length of 15 cm. Thus, the optical delay line can provide a variable time delay of 1.3 ns between the two beams, with a resolution of 0.01 ps. The pulse train illuminating the generator gap is chopped at 200 Hz via chopper 312, and the resultant signal from the sampling gap is fed to a lock-in amplifier (not shown).

The optically-activated photoconductive switches for picosecond pulse generation consist of 100-$\mu m$-wide by 5-$\mu m$-long gaps between metal conductors on a 245-$\mu m$ thick liquid-encapsulated-Czochralski (LEC)-grown GaAs semi-insulating substrate. They are fabricated between a planar 50-Ω microstripline and a shunt high-impedance line. The gaps are proton-implanted at 150 KeV with hydrogen at a dose of $10^{14}$ p/$cm^2$ on the surface of the substrate, in order to reduce the carrier lifetime. Oxygen-implantation, at a lower dosage, can also be used. A Ti-Au metal conductor thickness of 3 $\mu m$ can be used to achieve sufficiently low conductor loss. Because the shunt microstrip lines are designed to minimize the discontinuity seen by the electrical pulse, and by the microwave signal used in the experimental validation tests which is propagating along the 50-Ω transmission line, the presence of the switches has very little effect on the transmission characteristics of the pulses and microwave signals. In addition, a reference measurement can be performed and used to normalize the data for the MMIC.

When photons are absorbed in GaAs, electron-hole pairs are created, increasing the conductivity of the illuminated GaAs. In a biased photoconductor the photoconductive signal responds instantaneously to the optical pulse. The decay of the photoconductive signal is influenced by carrier recombination and carrier sweep-out Whichever process has the shorter characteristic time constant dominates the photoconductive signal decay process.

In very pure GaAs, the recombination time is measured in microseconds, e.g. as disclosed by M. Neuberger, "III–V Semi-Conducting Compounds," *Handbook of Electropic Materials*, Vol. 2, IFI/Plenum 1971, p. 48, and is typically a factor of approximately $10^6$ longer than the required pulse length. Carriers in GaAs have a saturation velocity of approximately 0.1 $\mu$m/ps. If a constant electric field greater than 0.3V/$\mu$m can be maintained across the gap, the carrier sweep-out time for a 5-$\mu$m gap is 50 ps. However, in undamaged semi-insulating GaAs, current is observed to persist for as much as 200 ps after illumination of the gap ceases. This is because the electric field in the gap "collapses." creating a low field region in the center of the gap, from which carriers leak relatively slowly.

Figure 10:
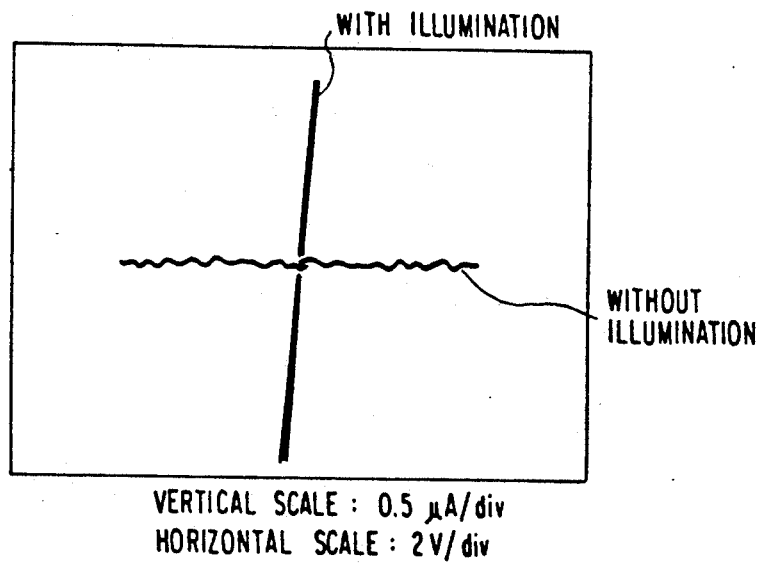
FIG. 10 illustrates a DC characterization of the optical switch.

The solution to the above problem is to heavily damage the GaAs lattice in the gap by proton implantation. This creates a high density of recombination centers, which reduces the recombination time to the sub-picosecond range. e.g.. as disclosed by F. E. Doany et al. "Carrier Lifetime versus Ion-Implantation in Silicon on Sapphire." *Appl. Phys. Lett.*, Vol. 50, pp. 460–462. 1987. The tradeoff for this is an increase in the illuminated resistance by a factor of 2 or more and a decrease in the dark resistance due to conduction via defect sites. The photoconductive switches for the present study typically have a dark resistance of several megohms, and with sufficiently intense illumination can have an illuminated resistance as low as several ohms. FIG. 10 shows the change in conductance as indicated in the I-V characteristics of a switch with illumination from a microscope light source and without illumination.

The measured FWHM pulse length at port b (FIG. 2) is 10 to 12 ps, close to the resistance/capacitance (RC) time constant of the photoconductive gap. Therefore, to obtain shorter pulses, it is necessary to reduce this time constant. When the time constant becomes negligible, the pulse length becomes the sum of the optical pulse length (5 ps in the present case) and the carrier recombination time. The carrier recombination time can be reduced, if necessary, by increasing the proton bombardment fluence. Shorter optical pulses will also decrease the electrical pulse duration. Optical pulses from lasers with a duration of 80 fs have been demonstrated, e.g.. as disclosed by D. Grischkowsky et al, "Photoconductive Generation of Sub-Picosecond Electrical Pulses and Their Measurement Applications." *Picosecond Electronics and Optoelectronics II*, Springer-Verlag 1985, and by M. B. Ketchen et al. "Generation of Sub-Picosecond Electrical Pulses on Coplanar Transmission Lines."*Appl. Phys. Lett.*, Vol. 48, pp. 751–753, 1986, and more recently pulses with a duration as short as 6 fs have been demonstrated. e.g.. as disclosed by C. V. Shank. "Generation of Ultrashort Optical Pulses." *Ultrashort Optical Pulses*, 3rd ed., Ch. 2, Springer-Verlag 1987.

The comparison of the measured results on both a 50-Ω line reference circuit and an MMIC from optical and network analyzer technique will now be described.

Figure 11A:
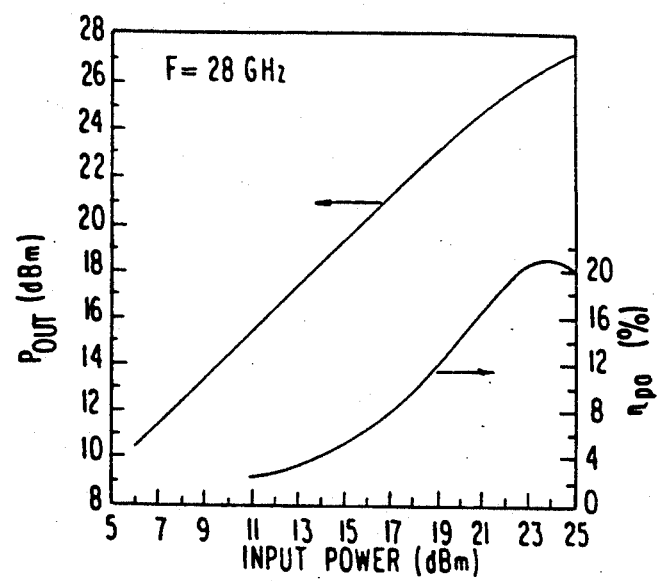
FIGS. 11A and 11B illustrate $K_a$-band performance for a single-stage amplifier.
Figure 11B:
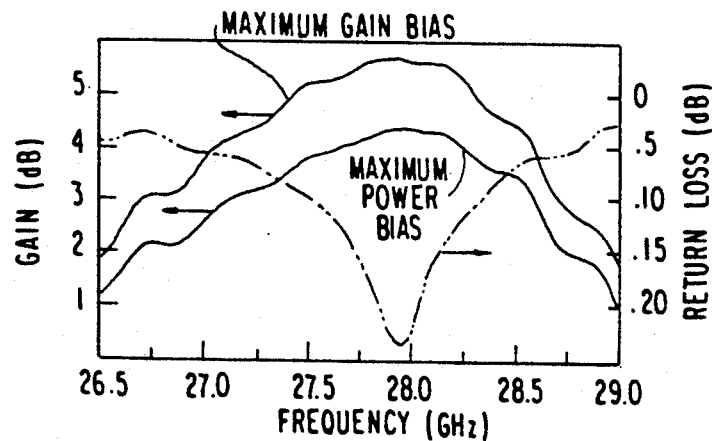

Two GaAS circuits were tested, one being the reference and the other the MMIC to be characterized. The reference circuit consisted of a sample 50-Ω microstrip line for overall system calibration. The MMIC to be tested was a two-stage power amplifier with a nominal gain of 4 dB per stage and an output power close to 0.5W at 28 GHz, e.g., as disclosed by H-L. A. Hung. A. Ezzeddine. L. B. Holdeman. F. R. Phelleps. J. F. Allison, A. B. Cornfeld. T. Smith, and H. C. Huang "$K_a$-Band Monolithic Power Amplifiers," *IEEE Microwave and Millimeter-Wave Monolithic Circuit Symp. Dig.*, (Las Vegas. Nev.), pp. 97–100, June 1987. FIGS. 11A and 11B show the nominal performance of a one-stage MMIC measured in a waveguide housing. An output power of 1W has been achieved with these MMICs in a balanced configuration.

The MMIC tested was mounted between two circuits, each containing two photoconductive switches, in the manner shown in FIG. 2. In the implementation of this technique, the bias of the switch and the collection of the signal are achieved with simple low-frequency probes (LFPs) at the end of the high-impedance shunt transmission lines. Since the sampled signals are at the 200-Hz chopper frequency, coaxial LFPs such as those used in the existing automatic on-wafer DC characterization are needed to pick up the sampled signal, eliminating the need for expensive microwave CPW probes. In the experiment, a bias voltage of 20V was applied to the photoconductive switches.

Figure 12:
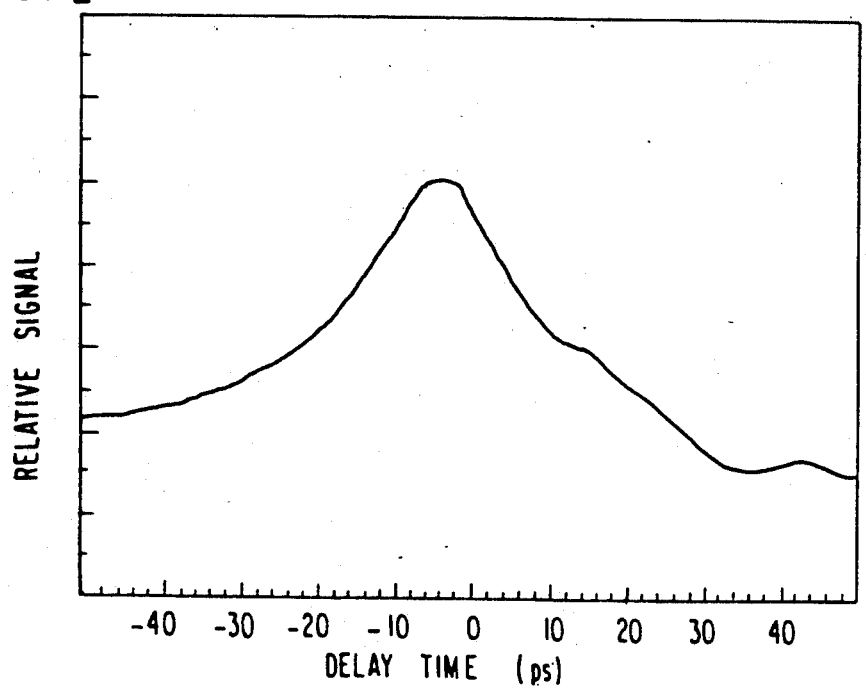
FIG. 12 illustrates time-domain correlation response measured at the input of a reference line.
Figure 13A:
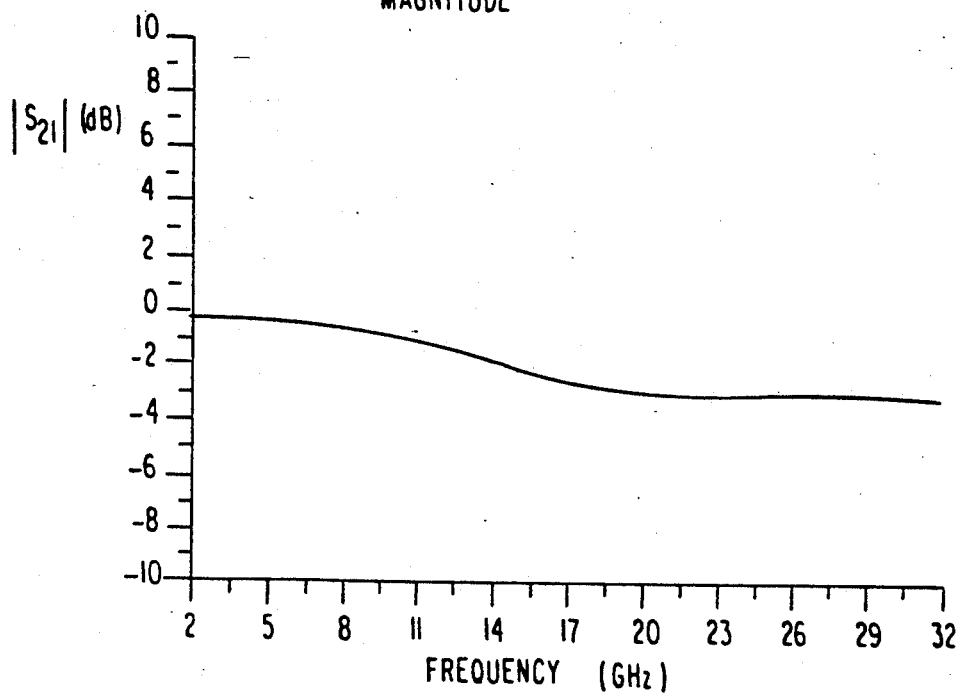
FIGS. 13A and 13B illustrate the frequency response of a 50 ohm reference line according to the optoelectronic technique of the present invention.
Figure 13B:
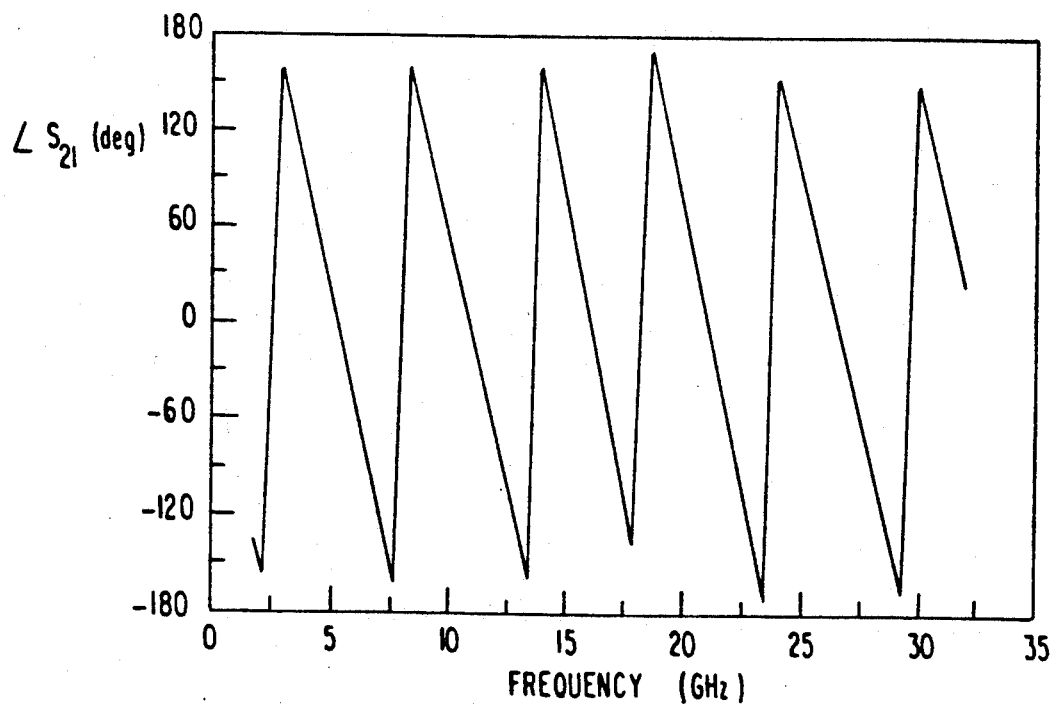

The measured autocorrelation signal at port b is shown in FIG. 12 for the case where data has been taken every 0.5 ps. A similar time response was obtained at the output port when the reference circuit was tested. In order to correctly determine the phase response of the device, the time delay between the signal at the input port and the signal at the output port was determined by moving the delay stage. For the reference circuit, this delay was 186 ps. The time domain data obtained at the output were shifted by this delay time before the FFT was performed. FIGS. 13A and 13B the transfer function magnitude and phase response of the 50-Ω reference line after the FFT of the time domain data. A 4,000-point FFT was used to obtain each set of the input and output spectral domain data. The time domain wave form was sampled during a time interval much shorter than the period of laser pulse repetition. For times between the end of the sampling interval and the beginning of the next laser cycle, the measured data were padded with zeros to improve the resolution.

Figure 14:
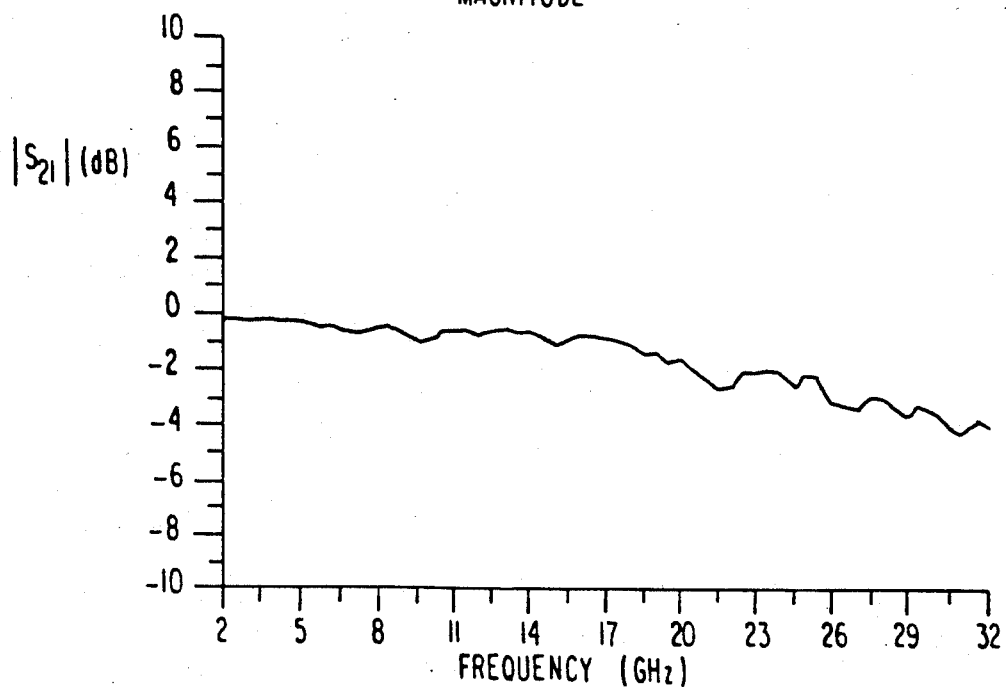
FIGS. 14A and 14B illustrates the frequency response of a 50 ohm reference line based on network analyzer measurement.
Figure 14:
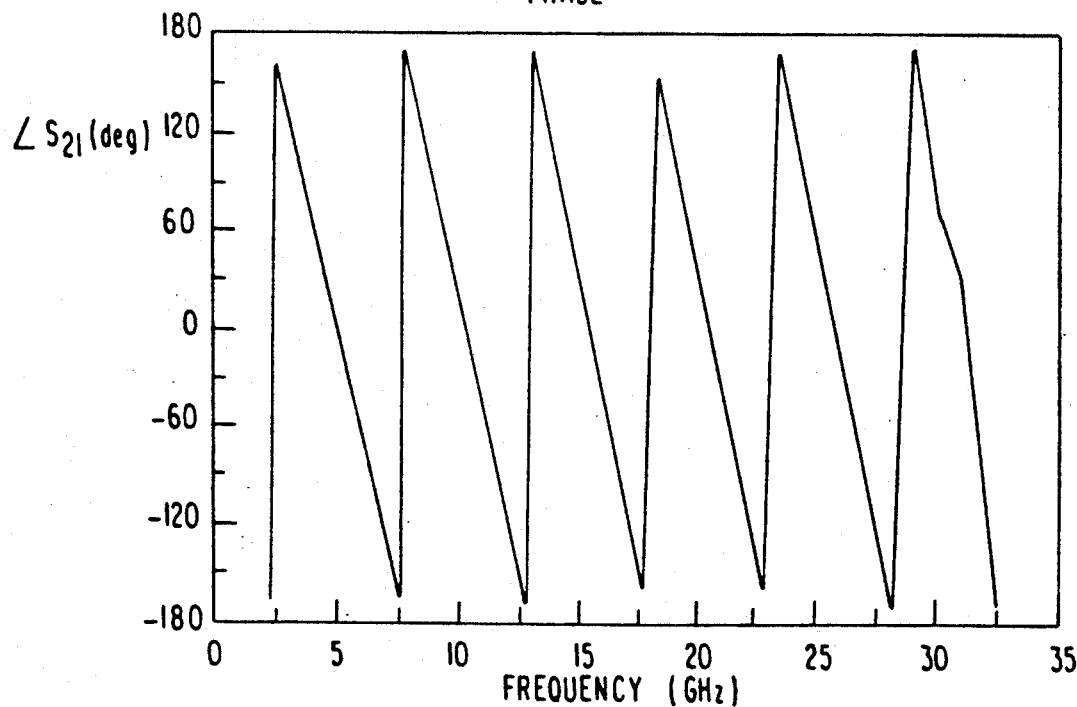

To verify these measured results the transfer function of the 50-Ω reference circuit was measured using an HP8510 network analyzer. An additional reference test fixture was also measured, to eliminate the effect of the coaxial launchers used in the reference line and MMIC measurements in the frequency domain. The reference circuit contained an appropriate length of GaAS 50-Ω microstrip line for circuit loss calibration. The transfer function for the reference line determined by this method is depicted in FIGS. 14A and 14B. The good agreement between the results in magnitude and phase shown in FIGS. 13 and 14 confirms the accuracy of the optoelectronic technique.

Figure 15:
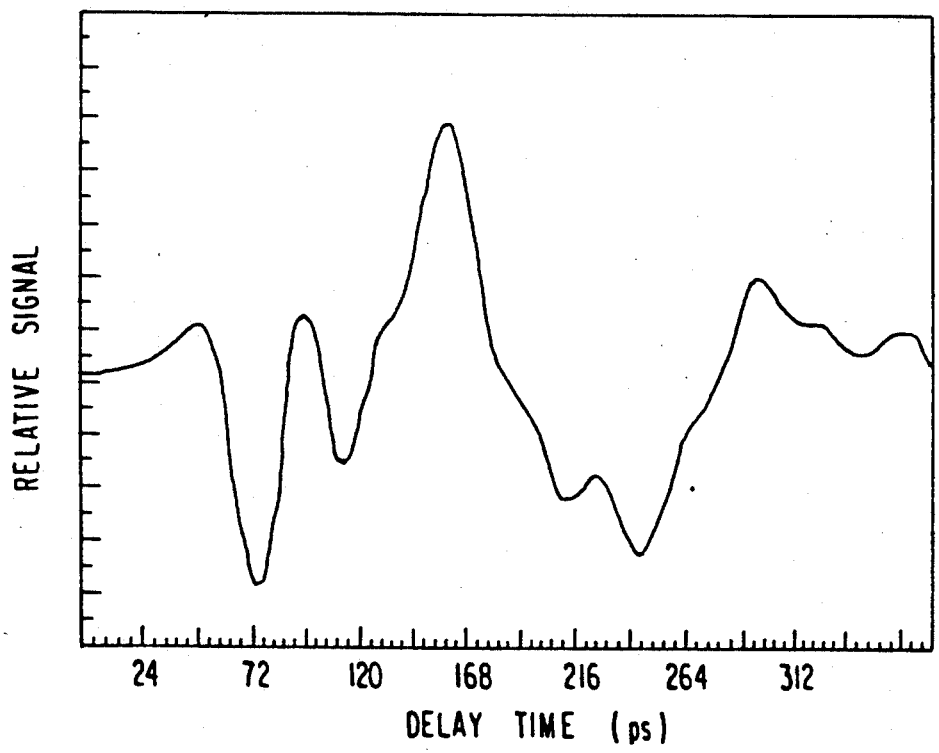
FIG. 15 illustrates time domain response at the output of the $K_a$-band MMIC.

For the MMIC circuit, the time domain signal obtained at the input port is similar to that of FIG. 12. The electrical pulse waveform detected at the output, which is shown in FIG. 15, consists of 800 points taken at 0.5-ps intervals. Since the electrical pulse was amplified through the MMIC with a narrow bandwidth around 28 GHz, the pulse at the output is expected to have a much broader waveform compared to that at the input.

Figure 16A:
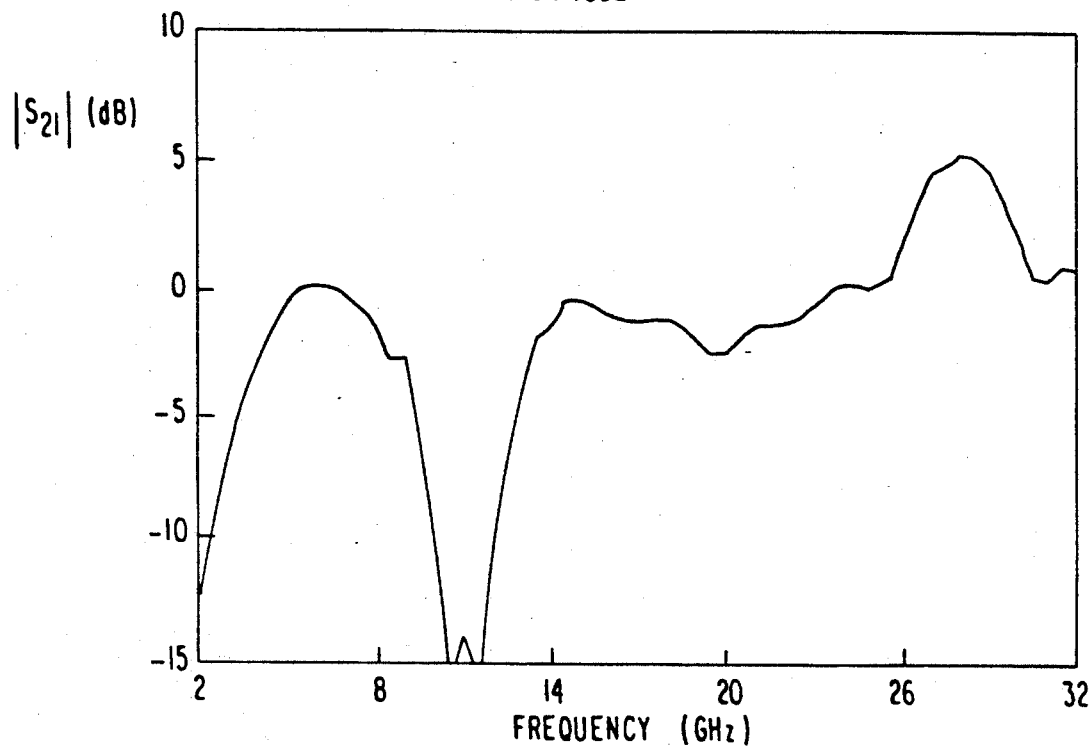
FIGS. 16A and 16B illustrates the frequency response of a two-stage MMIC amplifier according to the optoelectronic technique of the present invention.
Figure 16B:
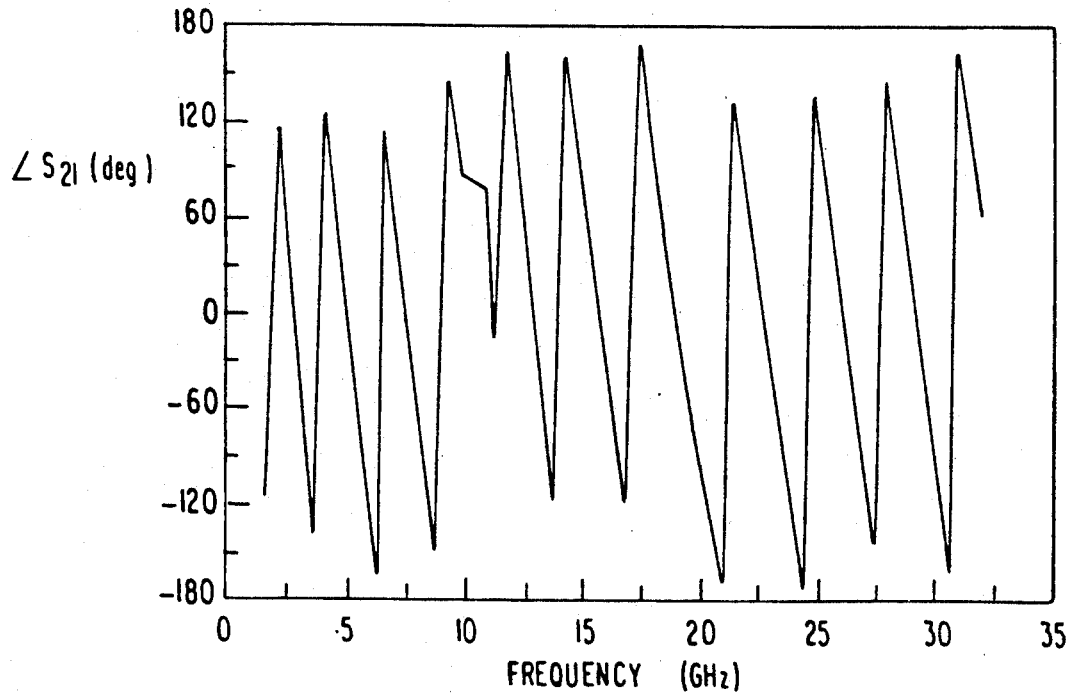
Figure 17A:
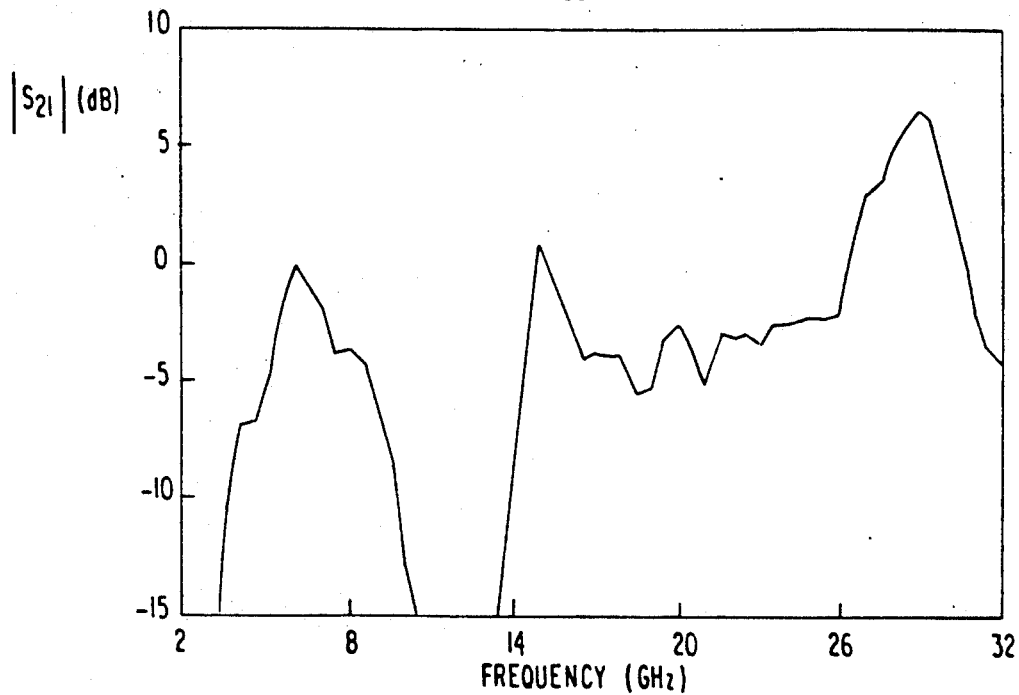
FIGS. 17A and 17B illustrates the frequency response of a two-stage MMIC amplifier according to a network analyzer measurement.
Figure 17B:
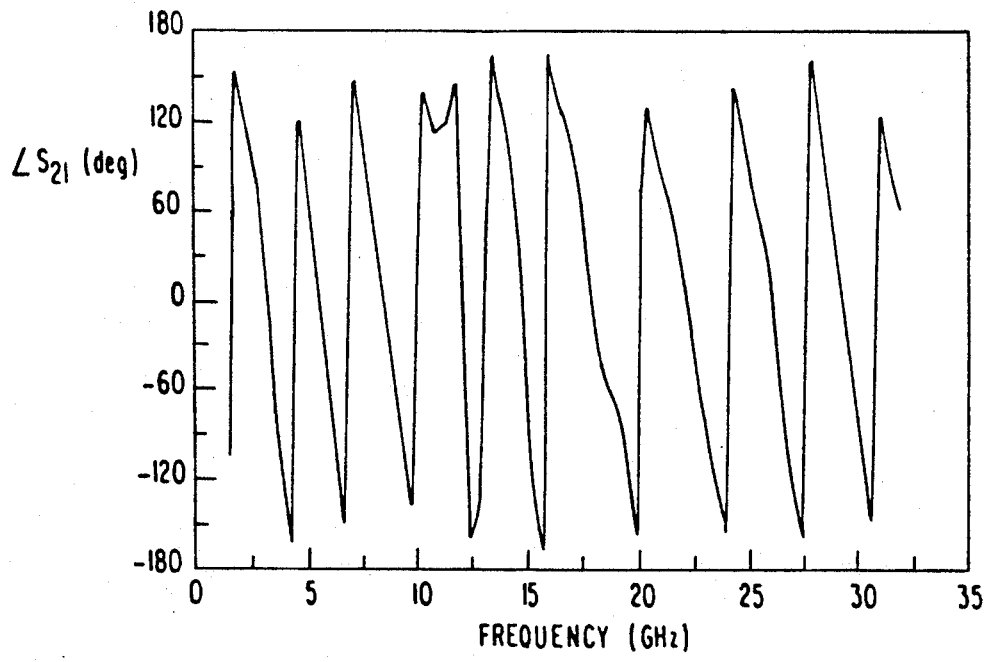

The magnitude and phase of the transfer functions, $S_{21}$, as determined by the FFT optical technique, are shown in FIGS. 16A and 16B. This can be compared with FIGS. 17A and 17B, which show the transfer function measured by the network analyzer technique. Good agreement in the broadband response was obtained. $S_{11}$ can be determined in a similar manner. In this case, both the input and reflected pulses are measured at the input port.

The optoelectronic technique has provided good results for S-parameters when compared to frequency domain network analyzer measurements. The dynamic range of the time domain technique achieved thus far is less than that from the HP8510 network analyzer when comparison is made at the lower microwave frequency range. However, this dynamic range can be improved by limiting the bandwidth of the optically generated electrical pulse. If broadband data are required, the time domain technique accomplishes this in one measurement, rather than as a super position of frequency domain measurements. Therefore, there is a bandwidth-/signal-to-noise tradeoff. The sensitivity of the present optoelectronic switch is also limited by the switch-off characteristics of the present photoconductors, which exhibited some leakage current. Better photoconductive switches can be fabricated to overcome this difficulty. The pulse amplitude could be raised by reducing the on state resistance with a lower fluence of protons, an increase in photoconductive gap size, or by using higher voltage across the switch.

The optoelectronic characterization technique described herein may be implemented using either auxiliary test structures on separate chips or by structures implemented on-chip. For application to on-wafer characterization, the mask set can be designed with microstrip test structures connected to the MMIC to be characterized. A pulse generation optical switch and a pulse sampling port (which can be an identical optical switch) must be placed at sites along the lines. The line length limit is determined by the need to resolve incident from reflected signals and to remove spurious reflections. The line lengths can be shortened by using shorter-duration electrical signals or by additional measurements and enhancing the FFT algorithm to separate the different signal waveforms. If these lines are made short and implemented in areas normally not occupied by devices, such as saw kerfs around the border on each MMIC chip or test pattern locations, the required test patterns can be incorporated on the wafer while maintaining the same chip density.

To allow the measurement of scattering parameters at each MMIC port, transmission lines terminated in their characteristic impedance may not be required, as in a conventional frequency domain measurement method. In the pulse technique, this requirement can be eliminated by using appropriate time domain windowing to remove the reflected pulses from the sampled data. Data collection is simply terminated before the reflected signal arrives at the sampling point. However, good RF terminations, especially on the output transmission line, will permit a reduction in the size of the test structure.

With the photoconductive switch for broadband spectral signal generation, electro-optic sampling could be used instead of built-in optical sampling switches along a transmission line. This has the advantage that the electric field (which is proportional to the voltage) at any point on the line, or even at any internal node within the MMIC itself, can be selected for sampling, e.g., as disclosed by B. Kolner et al. "Electro-optic Sampling in GaAS Integrated Circuits." *IEEE J. Quantum Electron.*, Vol. QE-22, pp. 79–93, January 1986, and by K. J. Weingarten et al, "Picosecond Optical Sampling of GaAS Integrated Circuit." *IEEE J. Quantum Electron.*, Vol. QE-24, pp. 198–220, February, 1988. In addition, this sampling technique causes minimal discontinuity since no physical sampling structure is required. Also of interest is the fact that the electro-optic sampling time is exactly the laser pulse duration. This can be made so short (well below 0.1 ps) that the sampling output is indistinguishable from the actual voltage versus time waveform being measured. The disadvantages are that adequate electric field magnitude and exact placement of the optical signal are required in order to obtain a meaningful detected signal, and this approach works best with materials that exhibit the electro-optic effect, such as GaAs. For measurements on materials which are not electro-optic, such as Si, an electro-optic probe can be used, e.g., as disclosed by J. A. Valdmanis et al. "Subpicosecond Electrical Sampling and Applications." *Picosecond Optoelectronic Devices*, Academic Press 1984, pp. 209–270. In this case, the magnitude of the electric field is more critical, but the probe material could be chosen to have the largest possible electro-optic effect.

The electro-optic sampling approach can be applied to the testing of the same MMIC used in the optoelectronic experiment, and similar time-domain waveforms are obtained from both the photoconductive and electro-optic techniques.

An optoelectronic characterization technique has been described which achieves broadband frequency response for both the magnitude and phase of a $K_a$-band MMIC. The optical system has been calibrated using a reference measurement, and the measured scattering parameters show close agreement with data obtained from network analyzer measurements on the MMIC amplifier. This technique offers significant potential for on-wafer characterization of both high speed devices and high-frequency circuits.

The invention does not require high frequency mechanical contact between the measuring system and the wafer for either waveform generation sampling containing millimeter-wave frequency spectrum. The same measuring system allows broadband operation from DC to 100 GHz, and can be extended to higher frequencies depending on the optical pulse rise and fall time and the photoconductive switch dynamics. A working model of the invention has been successfully demonstrated on a $K_a$-band (28 GHz) monolithic power amplifier circuit. A systematic study of the validity of this time domain measurement technique compared to the conventional frequency domain measurement approach shows excellent agreement in a direct comparison of measurements of the magnitude and phase of the frequency response of the same MMIC obtained using the optoelectronic technique of this invention with those from a conventional network analyzer measurement.

Based on these experiments, an automated measurement system suitable for the manufacturing environment can be developed to achieve high throughput in on-wafer MMIC evaluation. With an appropriate pulse width, the measurement system can be extended to frequencies above 100 GHz. The optical technique may also be applied to measurements of non-linear and multiport characteristics of MMIC components and subsystems.

It will be appreciated that various changes and modifications could be made to the embodiments disclosed above without departing from the spirit and scope of the invention as defined in the appended claims.

What is claimed is:

1. A system for testing a plurality of electrical devices each having an input side and an output side, said electrical devices being fabricated on a semiconductor wafer with areas of said wafer disposed between adjacent devices for cutting said devices from one another, said system comprising:

first means for generating at least first and second optical pulses;

second means responsive to said first optical pulse for generating an electrical signal at said input side of said device;

third means responsive to said second optical pulse for sampling an electrical signal at at least a first location which comprises one of said input and output sides of said device; and processing means for processing at least the electrical signal sampled by said third means to characterize said electrical device, wherein at least portions of said first, second and third means are formed in said areas of said semiconductor wafer, which will be cut from said device when dicing said wafer, and wherein said first means generates a third optical pulse, said system further including fourth means responsive to said third optical pulse for sampling said electrical signal at a second location which comprises the other of said input and output sides of said device.

2. A system for testing a plurality of electrical devices each having an input side and an output side, said electrical devices being fabricated on a semiconductor wafer with ares of said wafer disposed between adjacent devices for cutting said devices from one another, said system comprising:

first means for generating at least first and second optical pulses;

second means responsive to said first optical pulse for generating an electrical signal at said input side of said device;

third means responsive to said second optical pulse for sampling an electrical signal at at least a first location which comprises one of said input and output sides of said device; and processing means for processing at least the electrical signal sampled by said third means to characterize said electrical device, wherein at least portions of said first, second and third means are formed in said areas of said semiconductor wafer, which will be cut from said device when dicing said wafer, and wherein said second means comprises a first transmission line section, a bias source and means for coupling said bias source to said first transmission line section across a first photoconductive gap, and means for directing said first optical pulse to said photoconductive gap.

3. A system according to claim 2, wherein said third means comprises a second transmission line section and a first sampling capacitor coupled to said second transmission line section across a second photoconductive gap, and means for directing said second optical pulse to said second photoconductive gap.

4. A system according to claim 2, wherein said third means comprises a first sampling capacitor coupled to said first transmission line section across a second photoconductive gap, and means for directing said second optical pulse to said second photoconductive gap.

5. A system for testing an electrical device having an input side and an output side, said electrical device being fabricated on a semiconductor wafer, said system comprising:

first means for generating at least first and second optical pulses;

second means responsive to said first optical pulse for generating an electrical signal at said input side of said device;

third means responsive to said second optical pulse for sampling an electrical signal at at least a first location which comprises one of said input and output sides of said device, said third means comprising means for receiving said second optical pulse after reflection thereof from said device, and means for analyzing the polarization of the reflected pulse; and processing means for processing at least the electrical signal sampled by said third means to characterize said electrical device.

6. A system according to claim 5, wherein said first means comprises means for generating a laser pulse and means for deriving said first and second optical pulses from said laser pulse, at least one of said first and second optical pulses having a wavelength shorter than that of said laser pulse.

7. A system according to claim 5, wherein said first optical pulse has a wavelength shorter than that of said laser optical pulse.

8. A system according to claim 6, wherein said first optical pulse has a wavelength shorter than that of said laser optical pulse.

9. A system for testing an electrical device having an input side and an output side, said electrical device being fabricated on a semiconductor wafer, said system comprising:

first means for generating at least first and second optical pulses, said first means comprising a pulse laser for generating a laser pulse, optical means for passing said laser pulse along a primary optical path, beam splitting means for obtaining a plurality of secondary pulses from said laser pulse, and means for providing two of said secondary pulses as said first and second optical pulses, at least one of said first and second optical pulses having a wavelength shorter than a wavelength of said laser pulse;

second means responsive to said first optical pulse for generating an electrical signal at said input side of said device;

third means responsive to said second optical pulse for sampling an electrical signal at at least a first location which comprises one of said input and output sides of said device; and processing means for processing at least the electrical signal sampled by said third means for to characterize said electrical device.

10. A system according to claim 9, further comprising variable delay means disposed in the optical path of the secondary pulse for delaying the respective pulse by a desired amount.

11. A system according to claim 10, wherein said variable delay means comprises a path length adjustment means.

12. A system for testing an electrical device having an input side and an output side, said electrical device being fabricated on a semiconductor wafer, said system comprising:

first means for generating at least first and second optical pulses, said first means comprising a pulse laser for generating a laser pulse, optical means for passing said laser pulse along a primary optical path, beam splitting means for obtaining a plurality of secondary pulses from said laser pulse, a convex lens for receiving said two secondary pulses as parallel optical pulses with a first relatively wide spacing and for converging said two optical pulses toward one another in a direction toward said device, and a concave lens for receiving the converging optical pulses and for providing as an output said two optical pulses at a second spacing narrower than said first spacing;

second means responsive to said first optical pulse for generating an electrical signal at said input side of said device;

third means responsive to said second optical pulse for sampling an electrical signal at at least a first location which comprises one of said input and output sides of said device; and processing means for processing at least the electrical signal sampled by said third means to characterize said electrical device.

13. A system for testing a plurality of electrical devices each having an input side and an output side, said electrical devices being fabricated on a semiconductor wafer with areas of said wafer disposed between adjacent devices for cutting said devices from one another, said system comprising:

first means for generating at least first and second optical pulses;

second means responsive to said first optical pulse for generating an electrical signal at said input side of said device;

third means responsive to said second optical pulse for sampling an electrical signal at at least a first location which comprises one of said input and output sides of said device; and processing means for processing at least the electrical signal sampled by said third means to characterize said electrical device, wherein at least portions of said first, second and third means are formed in said areas of said semiconductor wafer, which will be cut from said device when dicing said wafer, and wherein said processing means is responsive to a plurality of sampled electrical signals from said third means for calculating a Fourier transform of a time domain waveform represented by said plurality of sampled electrical signals to obtain a frequency domain waveform for characterizing said device.

14. A system for testing an electrical device having an input side and an output side, said electrical device being fabricated on a semiconductor wafer, said system comprising:

first means for generating at least first and second optical pulses, said first means comprising a pulse laser for generating a laser pulse, optical means for passing said laser pulse along a primary optical path, beam splitting means for obtaining a plurality of secondary pulses from said laser pulse, and means for providing two of said secondary pulses as said first and second optical pulses, said means for providing comprising a convex lens for receiving said two secondary pulses as parallel optical pulses with a first relatively wide spacing and for converging said two optical pulses toward one another in a direction toward said device, and a concave lens for receiving the converging optical pulses and for providing as an output said two optical pulses at a second spacing narrower than said first spacing;

second means responsive to said first optical pulse for generating an electrical signal at said input side of said device;

third means responsive to said second optical pulse for sampling an electrical signal at at least a first location which comprises one of said input and output sides of said device; and processing means for processing at least the electrical signal sampled by said third means for to characterize said electrical device.

* * * * *